United States Patent [19]

Egerer

[11] 4,281,514

[45] Aug. 4, 1981

[54] APPARATUS FOR THE PRODUCTION OF ENERGY AND METHOD FOR UTILIZING THE PRESSURE AND/OR TEMPERATURE CONDITIONS IN DEEP WATERS

[76] Inventor: Paul K. Egerer, Schlüsselgasse 9, A 1040 Wien, Austria

[21] Appl. No.: 974,073

[22] Filed: Dec. 28, 1978

[30] Foreign Application Priority Data

Dec. 28, 1977 [AT] Austria .................................. 9376/77
Oct. 16, 1978 [AT] Austria .................................. 7430/78

[51] Int. Cl.³ .......................... F03G 7/02; F03G 7/04
[52] U.S. Cl. ................................. 60/641 R; 60/651; 60/671
[58] Field of Search .................... 60/641, 651, 671

[56] References Cited

U.S. PATENT DOCUMENTS

| 3,896,622 | 7/1975 | Daniello | 60/641 |
| 4,087,975 | 5/1978 | Owens | 60/671 |
| 4,100,744 | 7/1978 | De Munari | 60/671 |

*Primary Examiner*—S. Clement Swisher
*Attorney, Agent, or Firm*—McAulay, Fields, Fisher, Goldstein & Nissen

[57] ABSTRACT

Apparatus for the production of energy and method for utilizing the pressure and/or temperature conditions in deep waters, particularly in the sea, for the production of energy. Two similar tanks are provided which are adapted to contain a flowable medium which can be influenced by the outside pressure and/or the outside temperature. The physical state of the medium, particularly its state of aggregation and/or its volume, can be varied under the action of pressure and/or temperature. One of the tanks is lowered into a deep water or sea in which the pressure and/or temperature conditions are substantially different from the atmosphere outside the water, and this difference causes the medium to rise in a connecting pipe connecting the two tanks to flow into the other tank which is arranged on the water surface outside the water in which the energy of flow of the rising medium as it flows to the other tanks through the connecting pipe is utilized.

19 Claims, 4 Drawing Figures

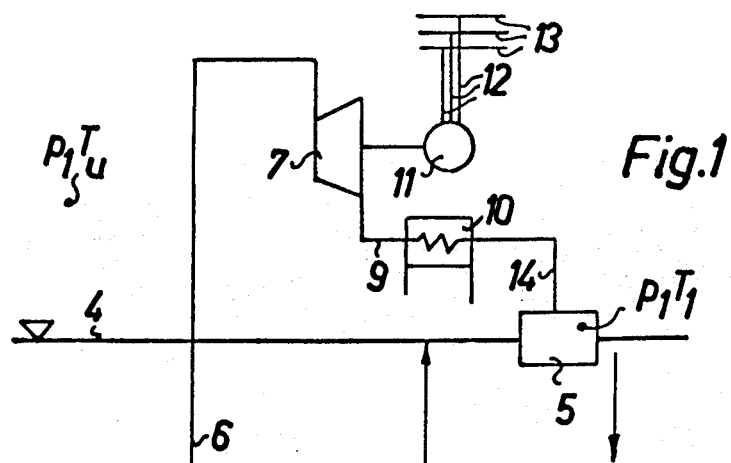
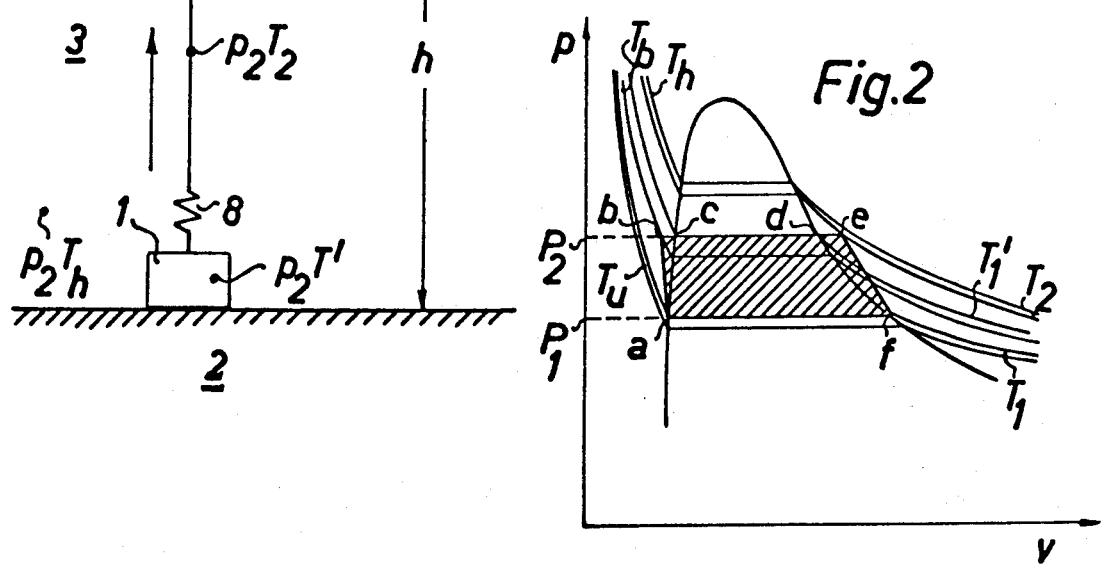
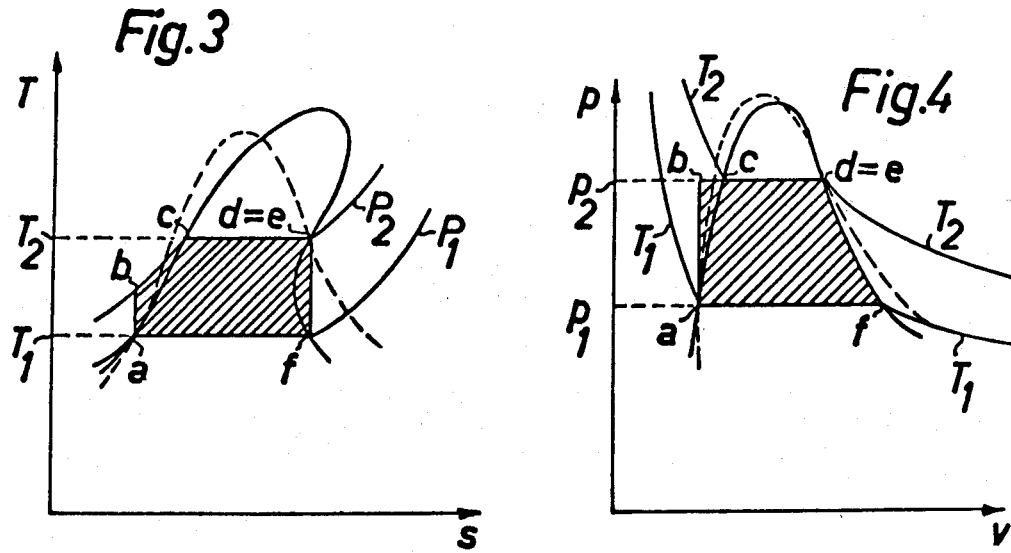
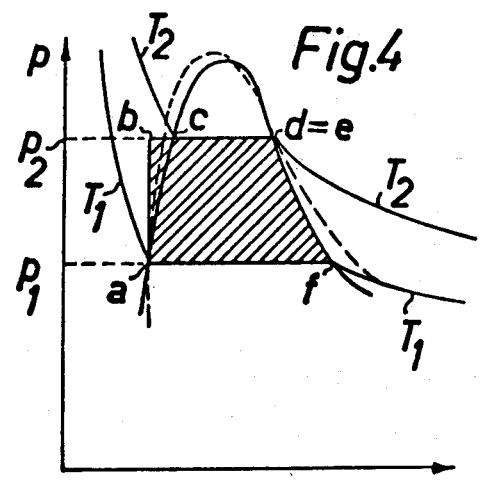

APPARATUS FOR THE PRODUCTION OF ENERGY AND METHOD FOR UTILIZING THE PRESSURE AND/OR TEMPERATURE CONDITIONS IN DEEP WATERS

BACKGROUND OF THE INVENTION

The invention concerns a method for utilizing the pressure- and/or temperature conditions prevailing in deep waters, particularly in the sea for the production of energy as well as a device for carrying out this method.

As known, there is an urgent need for non-polluting methods for obtaining energy, which permit the utilization of natural forces without using up basic substances, particularly fuels, which exist naturally on the earth in limited quantities only, and which cannot be justified in the long run either from an economical viewpoint or in view of the resulting environment pollution and ecological changes.

The object of the invention is thus to provide a possible non-polluting method for obtaining energy in a reversible and reproducible manner from existing natural forces without the use and consumption of valuable raw materials.

The invention is based on the finding that the physical conditions in the depth of waters, particularly the constant pressure and/or temperature conditions prevailing there, which as known, differ considerably from the physical conditions outside these waters, can be used with advantage for generating energy based on differences of these conditions.

So-called heat pumps, which can utilize the differences of the temperature conditions for the production of energy, already belong to the state of the art.

The method according to the invention, on the other hand, comprises the following steps:

A tank whose contents can be influenced by the respective outside pressure and/or by the respective outside temperature, and which contains a medium varying its physical state, particularly its state of aggregation and/or its volume, under the action of pressure and/or temperature is lowered into a depth of the water in which the pressure- and/or temperature conditions are substantially different from the atmosphere outside the water, which cause the medium, preferably by varying its state of aggregation, to rise in a connecting pipe leading to a preferably identical tank arranged on the surface outside the water, in which the energy of flow of the rising medium is utilized preferably by mechanical means.

In this method, the medium is not used up, and can be readily used again and remains fully available for a repetition of the steps in the opposite direction of flow. Only the considerable differences in the pressure- and/or temperature conditions inside and outside the water are used for the production of energy.

In contrast to the known heat pumps used for generating energy, no pumping power is required in the method according to the invention.

Preferably a medium is used in the subject of the invention whose specific gravity in the liquid state is greater than 1, so that the tank filled with the condensed medium can sink readily to the desired depth without any auxiliary means.

In order to ensure the desired course of the method of the invention, it is advisable to keep the tank in the desired nominal depth to the end of utilizable upward flow, e.g. by means of remote-controlled holding elements.

The method according to the invention is reversible and can be repeated resp. in the opposite direction insofar as a tank, used as a collecting tank, can be lowered to the desired depth, after it has been filled with the condensed, liquefied medium, to be used in the depth as a starting tank, with the gaseous medium traversing the connecting pipe in the opposite direction. It is advisable to use tanks which float in the empty state, which rise by themselves to the water surface, after the gaseous medium has been removed and the tank has been detached from a mount in the depth of the water, but which sinks automatically to the nominal depth when filled with a specifically heavier medium.

The medium contained in the respective starting tank is preferably under an excess pressure before it is lowered in order to change its state of aggregation, for example, for liquefaction, which pressure conditions or the changes of the physical properties necessary for the medium to rise in the connecting pipe.

According to another very essential feature of the invention the medium is deposited in its respective flow path in condenser behind the energy converter, e.g. a turbine. This way no backpressure can be formed in the vapor circuit according to the invention, which could hinder or stop the course of the method. It is desirable if the condensation pressure behind the energy converter is at least substantially identical with the atmospheric pressure, otherwise elaborate chambers would have to be provided.

The steam should be superheated in its path to the energy converter to such an extent that the turbine, etc. which is used as such a converter, does not work in the wet steam range; the condensed particles of the medium would reduce as droplets the output of the energy converter and would cause considerable wear of the energy converter.

The density of the condensate should be as high as possible, compared to that of water, so that the tank to which the medium is fed in the boiling state actually is made to sink rapidly. According to another feature of the invention, the following substances are suitable as media: chlorine, hydrogen iodide, methane difluoride, ethylene trifluoride, also octofluorcyclobutane, if necessary. Propane would meet the required conditions regarding pressure and temperature even better, but it has a too low density of about 525 kg/cu m. Octofluorclobutane is particularly suitable insofar as the expansion of the saturated steam does not take place in the wet steam range. The greatest mechanical performance can be expected when working with superheated methane difluoride vapor.

The invention also relates to devices for carrying out the above described methods.

Such a device is substantially characterized by a first floating tank which can be filled with a liquid or gaseous medium and closed by a valve, by a preferably identical tank, which can likewise be closed by such a valve, as well as by a connecting pipe in which is arranged an energy converter for utilizing the flow of the medium from one tank to the other for the production of energy.

In the connecting pipe is arranged at least one condenser, and preferably also at least one superheater.

The specific volume and the space requirement of the medium are considerably increased by the evaporation, under certain circumstances a thousand times. If no volume change is permitted, the pressure in the tank can increase to such an extent that no evaporation takes place and would have to be stopped after the tank has been lowered. It is therefore advisable to change the size of the tank and its volume resp. in the course of the method and to regulate it optimally in such a way that the required optimum pressure conditions are obtained in the tank. This can be achieved, for example, in this way that the degree of filling of the tank is varied or that the capacity of the tank is limited upward, for example, by designing the tank as a sylphon or in telescope fashion.

On the one hand, the tank should be readily insulatable to prevent evaporation of the medium during the sinking on the other hand, however they should ensure a good heat transfer in the lowered state. Within the framework of the invention it is possible to provide either an insulation which meets the two conditions satisfactorily on the average, or to provide variation of the insulating effect of the tank walls, which leads to a corresponding result. Such an insulation, which is variable in its intensity, can be achieved in various ways on the basis of the state of the art, for example, by using a tank shell whose filling is variable or which encloses the tank only in phases, e.g. which forms a shaft in certain regions in the path of the tank in which the tank is raised or lowered, or a bell which sinks together with the tank and which releases it only in the lowest position. After the tank has been lowered, a good preferably rapid heat transfer should be provided in any case.

BRIEF DESCRIPTION OF THE DRAWINGS

The attached drawings serve to illustrate the subject of the invention. FIG. 1 shows schematically the course of the method and the details of the required device.

FIGS. 2 to 4 show phase diagrams.

Specifically FIG. 2 shows graphically the course of the physical changes in the course of the method.

FIG. 3 shows a temperature entropy diagram and,

FIGS. 3 and 4 show different limiting curves for comparison.

DESCRIPTION OF THE PREFERRED EMBODIMENTS

According to FIG. 1, a tank is in a low position on bottom 2 of sea 3, whose free surface is designated with 4.

The second tank 5 arranged in the range of the free surface 4 of the water 3 is connected over connecting pipe 6 with tank 1 on the bottom, which leads to the turbine 7 used as an energy converter; in this connection pipe 6 is arranged in the range of tank 1 a heat exchanger 8 acting as a super-heater.

A connecting pipe 9 connects turbine 7 with a condenser 10. This turbine 7 is associated with a generator 11 from which current lines 12 lead to a current supply network 13. The medium flowing to tank 5 arrives there over connecting pipe 14.

Let us assume that a pressure p1 and a temperature T1 prevail in upper tank 5. While a pressure p2 and a temperature T2 prevail in the lower tank (immediately before it rises, hence in the operating state). The atmospheric pressure is likewise substantially p1, the temperature outside the water 3 is Tu, but the pressure in depth h under the water is substantially p2, and the temperature there is Th. In connecting pipe 6 the pressure is p2 and the temperature T2.

FIGS. 2 to 4 show phase diagram. The hatched areas indicate the work during a cycle related to 1 kg mass (or output related to 1 kg/s). The work in the cycle results also as the difference of the supplied and dissipated heat.

Specifically FIG. 2 shows the cycling access for the method according to the invention. In addition to the limiting curves, and the phase diagrams during the cycling process. The p–v diagram contains most important isotherms.

Immediately after the sinking (without heat exchange) the medium has the temperatue Tb (FIG. 2). In tank 1 is formed saturated steam, due to the heat supply through the surrounding water, which is subsequently brought to the temperature T2 in the superheater, heat exchanger 8. This temperature T2 should be so high that the expansion in turbine 7 remains below the wet steam region. Tank 1 contains in the operating state boiling medium and saturated steam.

Below the limiting curve is the two-phase region (wet steam region).

The following states result:
a: state behind condenser 10 and in tank 5
b: state directly after the sinking of tank 1 (without heat exchange with its environment)
c: state of liquid in tank 1 in operation
d: state of steam in tank 1 in operation
e: state of steam after superheating in superheater (heat exchanger 8) until it enters turbine 7
f: state behind turbine 7 until it enters condenser 10.

FIG. 3 shows the overhanging limiting curve in the temperature-entropy diagram. The limiting curve of conventional substances is shown in broken lines for comparison.

FIG. 4 shows a comparison of the two limiting curves from FIG. 3 in the p–v diagram.

FIG. 2 shows the variations of the physical values of the medium during the thermodynamic process, where the abscissa shows the specific volume with the value v, and the ordinate pressure p.

In this diagram representing the limiting curve, the various ranges have the following meaning:
a–b: the lowering of tank 1 which should be effected possibly without heat exchange and the tank should be well insulated
b–c: the heating of the medium to boiling temperature T' in the lowest position of tank 1 by the surrounding water
c–d: the evaporation of the medium
d–e: the superheating of the saturated steam to temperature T2 in heat exchanger 8
e–f: the energy conversion, due to utilization of the pressure gradient in turbine 7
f–g: the condensation of the medium in condenser 10.

The heated area of the diagram is the working area, it is a measure of the output of the method to be expected.

Understantably the temperature range in which the work is done is determined by the ambient temperature Tu of the atmosphere with which condenser 10 is cooled, and by temperature Th in depth h.

The pressure p1 in depth h should be so high that the expansion of the superheated steam with temperature T2 does not take place in the wet steam region. In order to be sure the heating transfer T2 (Th and Tl) must be Tu. About 3 degC. are sufficient for the required temperature differences.

The method of operation and the efficiency of the method according to the invention are particularly favorable when the working medium has an "overhanging" limiting curve which represents a phase diagram, as shown in FIG. 3, in which the specific entropys is plotted on the abscissa, and the temperature T on the ordinate. The area enclosed by the limiting curve corresponds to the difference between the supplied and the dissipated heat. In such a medium, there is no condensation during the expansion of the saturated steam in turbine 7, and the state after the expansion is again on the limiting curve according to the specific entropy diagram in FIG. 3, and the pressure-volume diagram resp. in FIG. 4.

As mentioned above, the density of the condensate should be high relative to that of the water, that is, the tank with the condensate should sink properly and rapidly.

The following substances are therefore suitable as media for the method according to the invention:

| boiling temperature in deg C. | pressure (bar) | | density of boiling liquid at 0° deg C. (kg/cu m) |
|---|---|---|---|
| | 1 | 2 | 5 | |
| CHLORINE | | −17.2 | 10.0 | 1.469 |
| Hydrogen iodide | | −18.4 | 7.1 | 2,369 |
| methane difluoride | | −25 | 0.1 | 1,285 |
| sulfur dioxide | −10.3 | +6.1 | 31.8 | 1,435 |
| nitrogen tetroxide | | −4.7 | 21.2 | 1,490 |
| methyl chloride | | −6.7 | 21.7 | 1,362 |
| dichloromethane difluoride | | −12.5 | 15.7 | 1,394 |
| chlorotethylene trifluoride | | −11.5 | 15.2 | 1,370 |
| octofluorocyclobutane | | −7.0 | 39.0 | 1,616 |

The last mentioned medium has preferably the overhaning limiting curve according to FIG. 3. The state behind turbine 7, however, is in the range of the superheated steam and not, as in FIG. 3 and 4, on the limiting curve. The temperature difference can thus not be utilized so well.

NUMERICAL EXAMPLES

The maximum efficiency for a cycling process, which is carried out between the temperatures of 10 degC. and +5 degC. is $$eta-max = 5.4\%$$

If 3 degC temperature differences are taken into account for the heat transfer, we obtain eta−max = 3.27%. These low values for the efficiency do not exclude, however, an economical utilization of the method according to the invention, because plants for large quantities of energy can be built at low costs.

Specific output with:

| | superheated steam | | saturated steam | | |
|---|---|---|---|---|---|
| | $\left(\frac{kW}{kg/s}\right)$ | DELTA p (bar) | $\left(\frac{kW}{kg/s}\right)$ | DELTA p (bar) | (p₁) (bar) |
| sulfur dioxide | 8.37 | 0.39 | 20.93 | 0.9 | 1.0 |
| chloromethane difluoride | 16.74 | 1.16 | 23.02 | 2.32 | 3.6 |
| dichloromethane difluoride | 7.66 | 1.32 | 8.71 | 1.60 | 2.1 |
| octafluorcyclobutane | — | — | 4.81 | 0.63 | 1.0 |

In this table, DELTA p denotes the pressure difference, and p1 the pressure in condenser 10, At −10 degC., the pressure would be 0.9 bar, and at −7 degC. 1.0 bar.

With conventional substances we can expect at best a pressure difference of 2.5 bar at temperatures between −10 and +5 degC. If we consider that turbine 7 should not work in the wet steam range, and that its output would thus be reduced by condensing droplets, we can expect at best pressure of 1.5 bar.

Naturally the invention can be modified and expanded in details in many ways without departing from its spirit. Particularly with regard to the design of the two tanks 1 and 5, which alternately rise and sink, there are many possibilities of improving the desired mode of operation of the method.

In the schematic representation of FIG. 1 only heat exchanger 8 and condenser 10 which are associated with tank 1 are shown for simplicity's sake, hence only those parts of the device which effect the rising of tank 1. Naturally the same parts must also be associated with tank 5 which constantly moves up and down with tank 1.

I claim:
1. A method for the production of energy utilizing either the pressure condition or the temperature condition environment characteristics of deep water or both, particularly the sea, comprising:
positioning a first tank outside the water for use as a collection tank;
connecting a second tank to said first tank through a connecting pipe, said second tank containing a medium which varies its physical state, said physical state variation including a variation of its state of aggregation or its volume or both, variation of said physical state of said medium causes said medium to flow from said second tank into said first tank through said connecting pipe, said medium being responsive to and influenced by the pressure or temperature conditions or both of the deep water outside said tank;
lowering said second tank as a starting tank with said medium therein into said deep water in which the pressure condition or temperature condition or both are substantially different from the atmospheric conditions outside the deep water, thereby causing the medium to flow through said connect- ing pipe and rise therein for entry into said first tank; and utilizing the energy of flow of the rising medium for the production of energy by applying the energy produced to an energy converter.

2. The method according to claim 1, wherein said medium passes over into a gaseous state of aggregation at an increasing temperature and a decreasing pressure.

3. The method according to claim 1, wherein the specific gravity of said medium in the liquid state of aggregation is greater than 1.

4. The method according to claim 1, including:
retaining said second tank in its nominal depth by means of remote-controlled holding elements until completion of the utilization of the upward flow of the medium for the production of energy.

5. The method according to claim 1, including
lowering said first tank which initially served as a collecting tank after it has been filed with its contents to depth of said second tank for use as a starting tank, and raising said second tank above the water lever for use as a collecting tank with the medium traversing the connecting pipe in an opposite direction.

6. The method according to claim 1 or 5, including
putting the respective starting tank with the medium contained therein under excess pressure before it is lowered in order to change the state of aggregation, and reducing this pressure constantly after the lowering of the respective starting tank in order to enhance additionally the pressure conditions and the variations of the physical properties of the medium respectively which are necessary to make the medium rise in the connecting pipe.

7. The method according to claim 1, wherein said tanks float in the empty state.

8. The method according to claim 1, including condensing said medium in a condenser in the path of flow behind said energy converter.

9. The method according to claim 8, wherein the condensation pressure behind said energy converter corresponds approximately to the atmospheric pressure.

10. The method according to claim 1, wherein the medium has a density higher than the density of water, in the boiling state, and
said medium being a substance selected from the group consisting of chlorine, hydrogen, iodide, methane difluorine, sulur dioxide, nitrogen tetroxide, methoyl chloride, dimethane difluoride, ethylene trifluoride and octofluorcyclobutane.

11. Apparatus for the production of energy utilizing either the pressure condition or the temperature condition environment characteristics of deep water or both, comprising
a first floatable tank including means for receiving and transferring a flowable fluid medium, a first closable regulating valve operatively associated with said first tank;

a second floatable tank similar to said first floatable tank including means for receiving and transferring a recirculating flowable medium to and from said first tank, a second closable regulating valve operatively associated with said second tank;

a connecting pipe coupled to said first-mentioned means and said second mentioned means to provide a pathway for flowing said flowable medium between said first tank and said second tank; and, an energy converter coupled to said connecting pipe and responsive to the flow of said flowable medium in said connecting pipe for utilizing energy contained in said flowable medium.

12. Apparatus according to claim 11, including a condenser in said connecting pipe behind said energy converter in the direction of flow.

13. Apparatus according to claim 11, including a heat exchanger in said connecting pipe in the range of each tank.

14. Apparatus according to claim 11, wherein the volumetric capacity of said tanks is variable.

15. Apparatus according to claim 11, wherein the degree of filling of said tanks is variable.

16. Apparatus according to claim 11, wherein said walls of said tanks have variable and regulatable insulation.

17. Apparatus according to claim 11, wherein the specific gravity of said recirculating medium is greater than 1.

18. Apparatus according to claim 11, wherein the weight of each of said tanks and its outer configuration are interrelated so that when the tank is empty it floats on the water and when filled with said flowable medium it sinks.

19. The apparatus according to claim 11, wherein said medium is superheatd methane difluoride vapor or octofluorocyclobutane.

* * * * *